United States Patent [19]

Wetlaufer

[11] Patent Number: 5,192,886
[45] Date of Patent: Mar. 9, 1993

[54] SUB-NANOSECOND CALIBRATED DELAY LINE STRUCTURE

[75] Inventor: Gary D. Wetlaufer, Longmont, Colo.

[73] Assignee: Hewlett-Packard Company, Palo Alto, Calif.

[21] Appl. No.: 652,149

[22] Filed: Feb. 7, 1991

Related U.S. Application Data

[63] Continuation-in-part of Ser. No. 494,020, Mar. 15, 1990, abandoned.

[51] Int. Cl.⁵ .................. H03K 5/159; H03K 3/01
[52] U.S. Cl. .................... 307/595; 307/597; 307/602; 307/603; 307/605; 307/606; 328/55; 328/66
[58] Field of Search ............... 307/595, 597, 602, 603, 307/605, 606; 328/55, 66

[56] References Cited

U.S. PATENT DOCUMENTS

| | | | |
|---|---|---|---|
| 4,504,749 | 3/1985 | Yoshida | 307/590 |
| 4,700,089 | 10/1987 | Fujii et al. | 307/605 |
| 4,742,254 | 5/1988 | Tomisawa | 307/606 |
| 4,754,164 | 6/1988 | Flora et al. | 307/269 |
| 4,806,804 | 2/1989 | O'Leary | 307/605 |
| 4,878,028 | 10/1989 | Wang et al. | 307/602 |
| 4,899,071 | 2/1990 | Morales | 307/605 |
| 4,947,064 | 8/1990 | Kim et al. | 307/594 |
| 5,054,038 | 10/1991 | Hedberg | 307/595 |

OTHER PUBLICATIONS

T. Otsuji and N. Narumi, "A 10-ps Resolution Process-Insensitive Timing Generator IC", *IEEE Journal of Solid State Circuits*, vol. 24, No. 5, Oct. 1989, pp. 1412-1418.

Primary Examiner—Janice A. Howell
Assistant Examiner—Trong Phan

[57] ABSTRACT

Disclosed is a digital phase-locked loop circuit which provides a control signal for a delay circuit within the feedback path of the phase-locked loop. The circuit has a first series of delay circuits, which have an incremental control signal input, to delay an input clock signal to provide the D input to a D flip flop. The input clock signal is also connected to a second series of delay circuits. The output of this second series is connected to the clock input of the D flip flop. The voltage controlled delay signal input for the second series of delay circuits is supplied by a reference control signal. The output of the D flip flop is passed through a resistor-capacitor filtering circuit and fed back to the first series of delay circuits as the incremental control signal. The delay through the first series of circuits is incrementally larger than the delay through the second, reference, series of delay circuits.

6 Claims, 5 Drawing Sheets

SUB-NANOSECOND CALIBRATED DELAY LINE STRUCTURE

CROSS REFERENCE TO OTHER APPLICATIONS

This application is a continuation-in-part of application serial number 07/494,020 of Gary D. Wetlaufer entitled "Sub-Nanosecond Calibrated Delay Line Structure", filed Mar. 15, 1990 now abandoned.

FIELD OF THE INVENTION

This invention relates to electronic circuits and more particularly to electronic digital integrated circuits. Even more particularly, the invention relates to an electronic digital integrated delay line circuit.

BACKGROUND OF THE INVENTION

Because of process, power supply, and temperature variations, integrated circuits may vary in the speed at which they operate. CMOS integrated circuits may vary by factors of five or more in the speed at which they operate. The integrated circuit design engineer must design for and simulate the effects of these variables. In addition, the engineer who then uses the integrated circuit must also be concerned about unequal propagation delays between two or more identical integrated circuits. Another problem which arises is that of accurate delay lines integrated into a CMOS integrated circuit. With speed variations of five or more, a delay line must be long enough to provide the necessary delay at a best case speed situation. However, for the worst case speed situation, the delay line is five times longer than necessary, wasting valuable area and affecting yields.

One solution to the delay line problem is the use of commercially available external delay lines connected to the CMOS integrated circuit. Another solution is to use NMOS technology where integrated delay lines are available, but at a cost in power consumption. An NMOS integrated delay line works by altering the load at the output of cross-coupled NOR gates, which requires the use of a two-phase clock system. The effect is to require a relatively large amount of circuit area dedicated to the delay line in an NMOS integrated circuit.

A solution for CMOS integrated circuits is to use a CMOS inverter with a transistor connected in series between the inverter and VDD, and a second transistor connected in series between the inverter and ground. A voltage is applied to these two series transistors to cause them to alter the rise and fall time of the CMOS inverter circuit. This circuit is best described with respect to FIG. 1 below. The amounts of voltage needed to control the rise and fall times to cause a specific amount of delay is generated by a digital phase-locked loop circuit as described below with respect to FIG. 2, which is similar to the circuit of U.S. Pat. 4,899,071 issued Feb. 6, 1990 to Morales. The prior art circuit of FIG. 2, however, has a limitation in that the intrinsic delay naturally occurring in the inverter circuits causes a delay in addition to that generated by the phase-locked loop. The minimum resolution of the circuit is thus determined by adding the intrinsic delay of 10 each inverter circuit to the amount of delay needed to calibrate the phase-locked loop. This value will always be greater than the slowest uncompensated intrinsic delay for a given process. This intrinsic delay also becomes a significant factor when the delay circuits are used to form a delay line.

There is need in the art then for a circuit to produce a control signal that has been compensated for the intrinsic delay within the circuit producing the voltage. There is further need in the art for a delay line circuit that compensates for the intrinsic delay in the circuits and allows for higher resolution than the resolution provided by the uncompensated intrinsic delay of a series of CMOS inverters.

SUMMARY OF THE INVENTION

It is an aspect of the present invention to provide an improved control signal which is used to control voltage controlled current sources that delay a signal passing through a logic gate circuit within an integrated circuit.

Another aspect of the invention is to provide such an improved control signal that removes problems associated with intrinsic delay of the circuits used to provide the control signal.

A further aspect of the present invention to use such improved control signal to provide a delay line for an integrated circuit.

Another aspect of the invention is to provide such an improved control signal and such a delay line that are independent of process variations.

Another aspect of the invention is to provide such an improved control signal and such a delay line that are independent of power supply variations.

Another aspect of the invention is to provide such an improved control signal and such a delay line that are independent of temperature variations.

The above and other aspects of the invention are accomplished in a digital phase-locked loop circuit which provides a control signal. The control signal is used to control a voltage controlled current source in a delay circuit within the feedback path of the phase-locked loop, to delay the input signal to the loop and achieve phase-lock. The circuit has a first series of delay circuits which delay an input clock signal to provide the D input to a D flip flop. These delay circuits have a voltage controlled delay input which allows an incremental control signal to control the amount of delay through the circuits. The input clock signal is also connected to a second series of delay circuits and their output is connected to the clock input of the D flip flop. The voltage controlled delay input for the second series of delay circuits is supplied by a reference control signal supplied by a second phase-locked loop. The output of the D flip flop is passed through a resistor-capacitor filtering circuit and fed back to the first series of delay circuits as the incremental control signal. The D flip flop and the RC filter act as a mixer to resolve the difference in timing between the incremental control signal and the reference control signal. The delay through the first series of circuits is a function of the delay of the reference circuits, plus the delay provided by the incremental control signal input.

The incremental control signal and the reference control signal of the digital phase-lock loops can also be used to control a programmable delay line. The delay line is comprised of two delay paths, one controlled by the incremental control signal, and the other controlled by the reference control signal. The two paths consist of stages, with each stage having a delay that is a binary multiple of the delay provided by the previous stage.

BRIEF DESCRIPTION OF THE DRAWINGS

The above and other aspects, features, and advantages of the invention will be better understood by reading the following more particular description of the invention, presented in conjunction with the following drawings, wherein.

DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
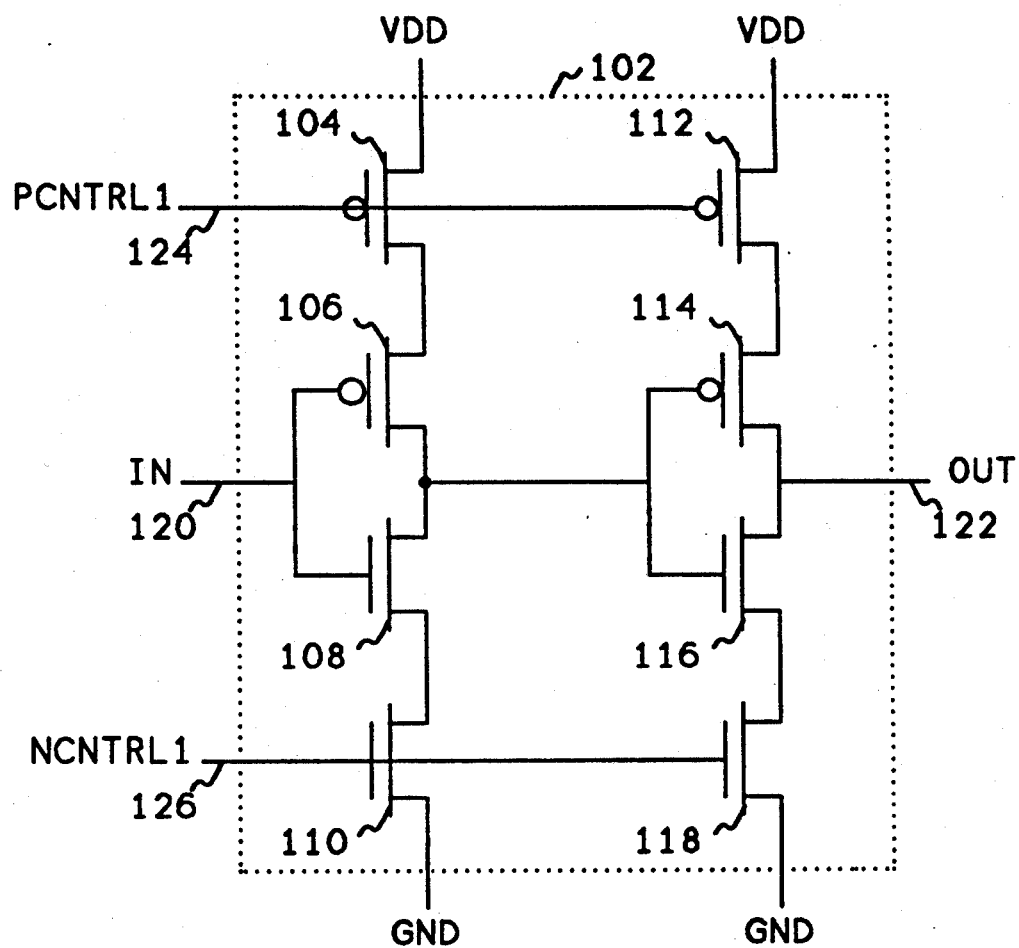
FIG. 1 shows a prior art CMOS delay circuit.

FIG. 1 shows a prior art delay circuit. Referring now to FIG. 1, PMOS FET 106 and NMOS FET 108 comprises a typical CMOS inverter circuit. PMOS FET 114 and NMOS FET 116 comprise a second CMOS inverter circuit. These two inverter circuits, in combination, provide an OUT signal 122 which is the same polarity as the IN signal 120, but delayed by the intrinsic delays of the four transistors. PMOS FET's 104 and 112 and NMOS FET's 110 and 118 act as voltage controlled current sources, controlled by the reference control signal (PCNTRL1) 124 and the reference control signal (NCNTRL1) 126 respectively. The PCNTRL1 signal 124 controls the rise time of the circuit, and the NCNTRL1 signal 126 controls the fall time of the circuit. By controlling the rise and fall time of the circuit, the propagation delay between the IN signal 120 and the OUT signal 122 is controlled.

The problem of identical integrated circuits (IC) operating at different speeds due to process, temperature, and power supply variations can be solved by extending the idea of using voltage control current sources to NAND and NOR gates in addition to the inverter.

Figure 2:
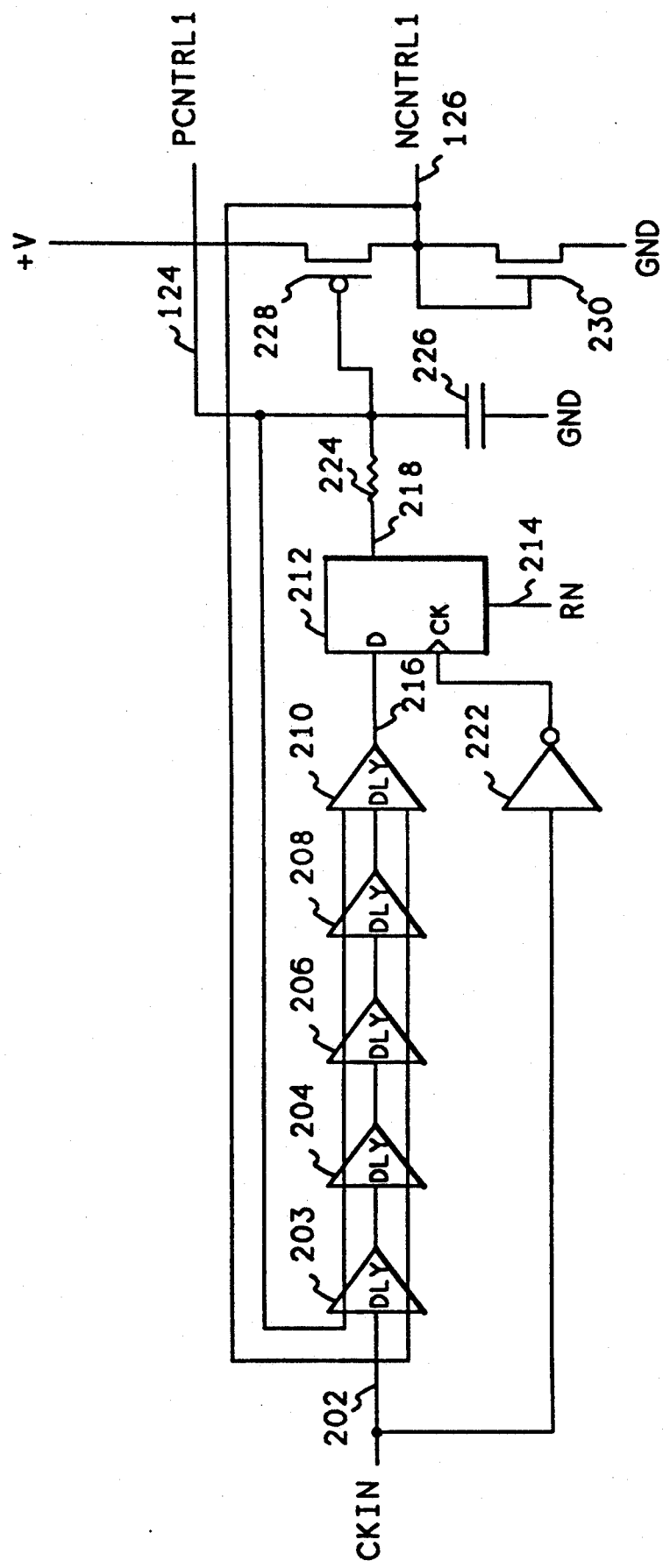
FIG. 2 shows a prior art circuit for creating reference control signals for the circuit of FIG. 1.

FIG. 2 shows a prior art digital phase-locked loop circuit for generating the PCNTRL1 signal 124 and the NCNTRL1 signal 126 This circuit is similar to the circuit of U.S. Pat. No. 4,899,071 issued Feb. 6, 1990 to Morales. Referring now to FIG. 2, a clock signal CKIN 202 is connected to a first delay circuit 203 which is serially connected to a delay circuit 204, a delay circuit 206, a delay circuit 208, and a delay circuit 210. The CKIN 202 signal is also connected to an inverter 222. The output 216 of the delay circuit 210 and the output of the inverter 222 are connected to the D and clock inputs respectively of a D flip flop 212. After the reset signal RN 214 is removed, PCNTRL1 will start to increase at a rate determined by the time constant of the RC network formed by resistor 224 and capacitor 226. Transistors 228 and 230 approximate an analog inverter to invert the PCNTRL1 signal 124 and produce the NCNTRL1 signal 126. When the D input 216 is delayed one-half of a clock period, the output 218 will go low and discharge capacitor 226. On the next cycle of CKIN 202, the output 218 will again go high causing capacitor 226 to charge positively. At this point the phase-locked loop is locked to the CKIN signal 202. The PCNTRL1 signal 124 and the NCNTRL1 signal 126 are automatically adjusted by the feedback loop to increase or decrease the delay provided by the delay circuits 203, 204, 206, 208, and 210, so that the circuit provides a phase lock at a value which causes the delayed version of the CKIN signal 202, produced by the output of delay circuit 210, to be 180 degrees out of phase with the non-delayed version of CKIN signal 202, produced by inverter 222. Thus, the delay for each delay circuit 203, 204, 206, 208, or 210 can be calculated by dividing the CKIN period by two times the number of delay circuits in the delay path. That is $T/2/5 = T*0.1$, where T is the period of CKIN.

Figure 3:
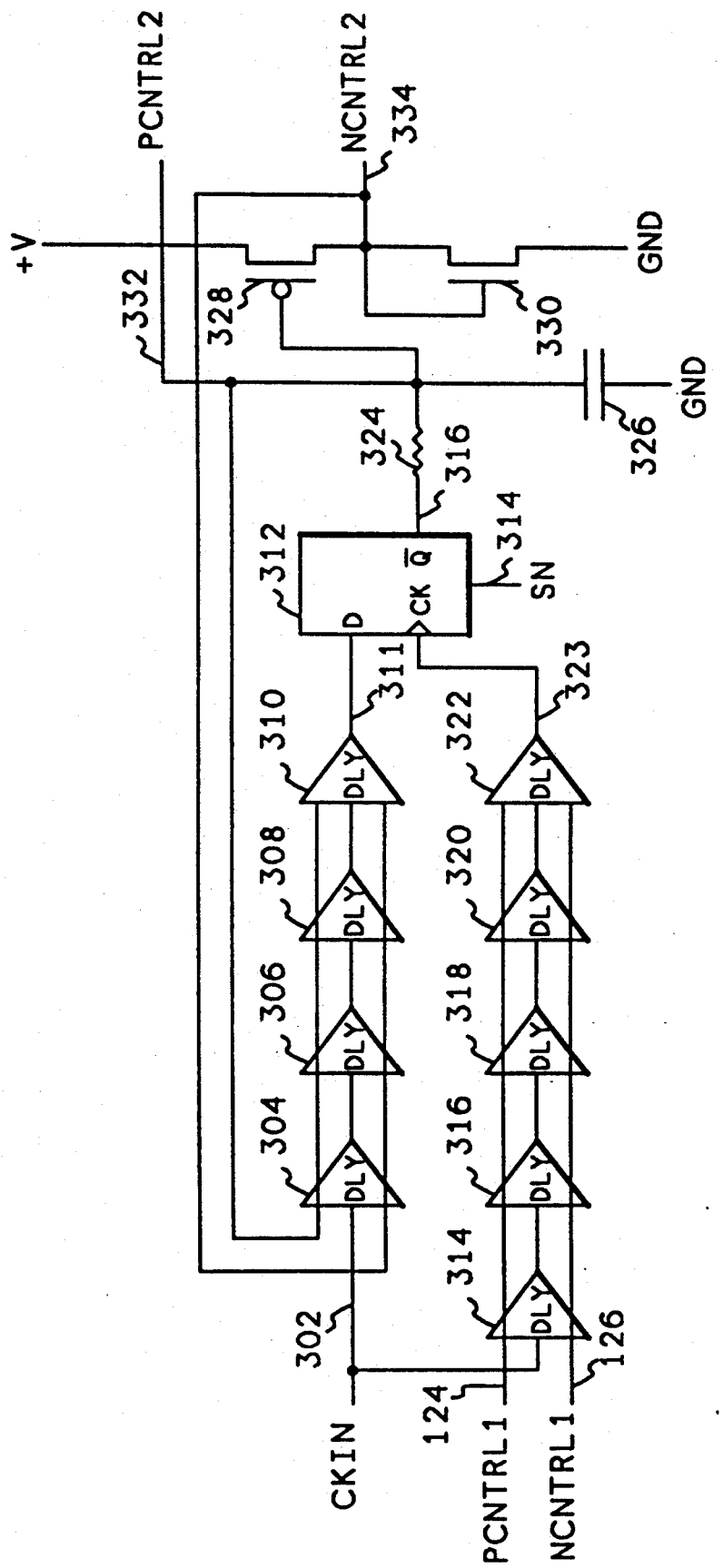
FIG. 3 shows the circuit of the present invention for creating incremental control signals.

FIG. 3 shows the circuit of the present invention for generating an additional set of PCNTRL and NCNTRL signals which can be used in other circuits to cause very small amounts of additional delay. Referring now to FIG. 3, a CKIN signal 302 is connected to a series of delay circuits 304, 306, 308, and 310. The output 311 of the delay circuit is connected to the D input of a D flip flop 312. The CKIN signal 302 is also connected to a series of delay circuits 314, 316, 318, 320 and 322. The output 323 of these circuits is connected to the clock input of the D flip flop 312. The inverted output 316 of the D flip flop 312 is connected to an RC network formed by a resistor 324 and a capacitor 326. The output of this network produces an incremental control signal PCNTRL2 332 which is fed back to the delay circuits 304, 306, 308, and 310 as the delay control signal input. The output of the RC network is also connected to an inverter circuit formed by transistors 328 and 330 which inverts the PCNTRL2 signal 332 to produce the incremental control signal NCNTRL2 334. The NCNTRL2 signal 334 is also fed back to the delay circuits 304, 306, 308, and 310 as the delay control signal input.

The reference control signals PCNTRL1 and NCNTRL1 from FIG. 2 are connected to the second set of delay circuits 314, 316, 318, 20 and 322 to create a reference delay. In this circuit, the CKIN signal 302 passes through two sets of delay circuits, and thus incurs the same delay in both paths. The delay path comprised of delay circuits 304, 306, 308, and 310 adds additional delay per element as provided by the PCNTRL2 and NCNTRL2 incremental control signals. The delay per delay element for delay circuits 304, 306, 308, and 310 is equal to the CKIN period divided by two divided by the number of elements in the clock path of the flip flop of FIG. 2 times the number of delay elements in the D path of the flip flop of FIG. 3 divided by the number of elements in the clock path of the flip flop of FIG. 3. In FIG. 3, this delay is $T/2/[5*(4/5)] = T*0.125$, where T is the period of CKIN. Thus the PCNTRL2 and NCNTRL2 signals provide a provide a small incremental delay, relative to the delay provided by PCNTRL1 and NCNTRL1, to provide high resolution. The actual number of delay elements in each path is variable and the difference determines the final programmable resolution of delay lines which will use these elements.

Figure 4:
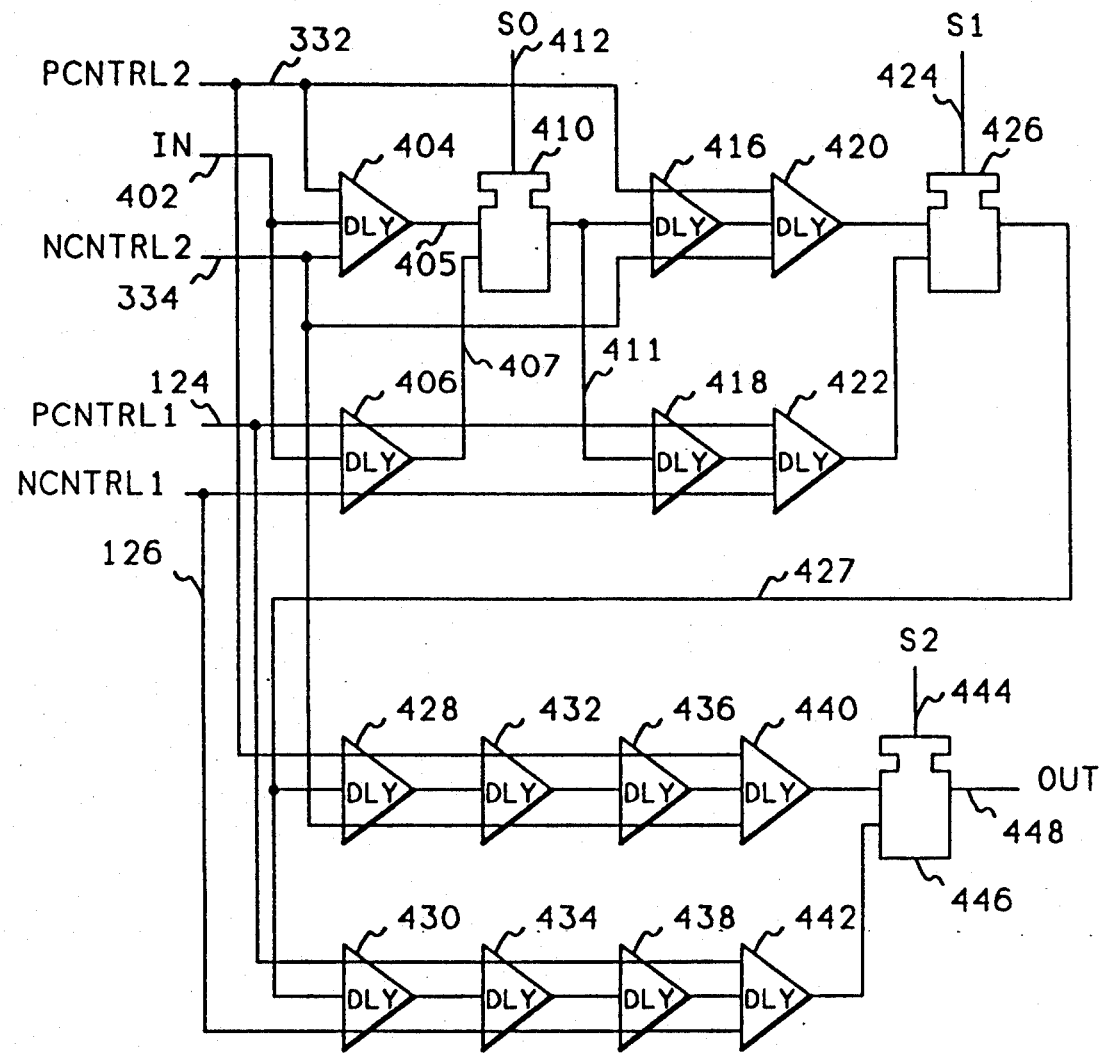
FIG. 4 shows the programmable delay circuit of the present invention.

FIG. 4 shows a programmable delay circuit which uses the PCNTRL and NCNTRL signals developed by the circuits of FIGS. 2 and 3. Referring now FIG. 4, an input signal 402 is connected to a delay circuit 404 and a delay circuit 406. The delay circuit 404 also has incremental control signals PCNTRL2 332 and NCNTRL2 334 as an input. Therefore the delay circuit 404 will delay the IN signal 402 by amount as defined by the PCNTRL2 and NCNTRL2 signals. Delay circuit 406 has the reference control signals PCNTRL1 124 and NCNTRL1 126 as its control voltage signal inputs. Therefore, delay circuit 406 will delay the IN signal 402 by an amount as defined by the PCNTRL1 and NCNTRL1 signals, which is less than the delay provided by delay circuit 404. The output of delay circuit 404 is fed to one input of a multiplexer 410. The output of delay circuit 406 is connected to the other input of the multiplexer 410. A select signal S0 412 is input to multiplexer 410 to select either the delayed signal output of delayed circuit 404 or the smaller delayed output of the delay circuit 406. Thus S0 selects an incremental delay equal to the difference in the delay amounts. The output 411 of the multiplexer 410 is connected to a delay circuit 416, whose output is connected to a second delay circuit 420. The output 411 of the multiplexer 410 is also connected to a delay circuit 418 whose output is connected to a second delay circuit 422. The output of the delay circuit 420 is connected to one input of a multiplexer 426 and the output of the delay circuit 422 is connected to the other input of multiplexer 426. The control input for the multiplexer 426 is the S1 signal 424. An output 427 of the multiplexer 426 is connected to a series of delay circuits 428, 432, 436, and 440. The output of this series of delay circuits is connected to one input of a multiplexer 446. The output 427 of the multiplexer 426 is also connected to a series of delay circuits 430, 434, 438, and 442. The output of this series of delay circuits is connected to the other input of multiplexer 446. The control input of multiplexer 446 is the S2 signal 444. Signal 448 comprises the output of the programmable delay circuit.

The three control inputs S0 412, S1 424, and S2 444, provide a three-bit select word that controls the selection of delay values from zero through seven for delaying the IN signal 402 to the OUT signal 448. Control signal S0 412 selects a delay value of zero or one times the difference in the delay amounts. Control signal S1 424 selects a delay value of zero or two times the difference in the delay amounts, and control signal S2 444 selects a delay value of zero or four times the difference in the delay amounts.

Figure 5:
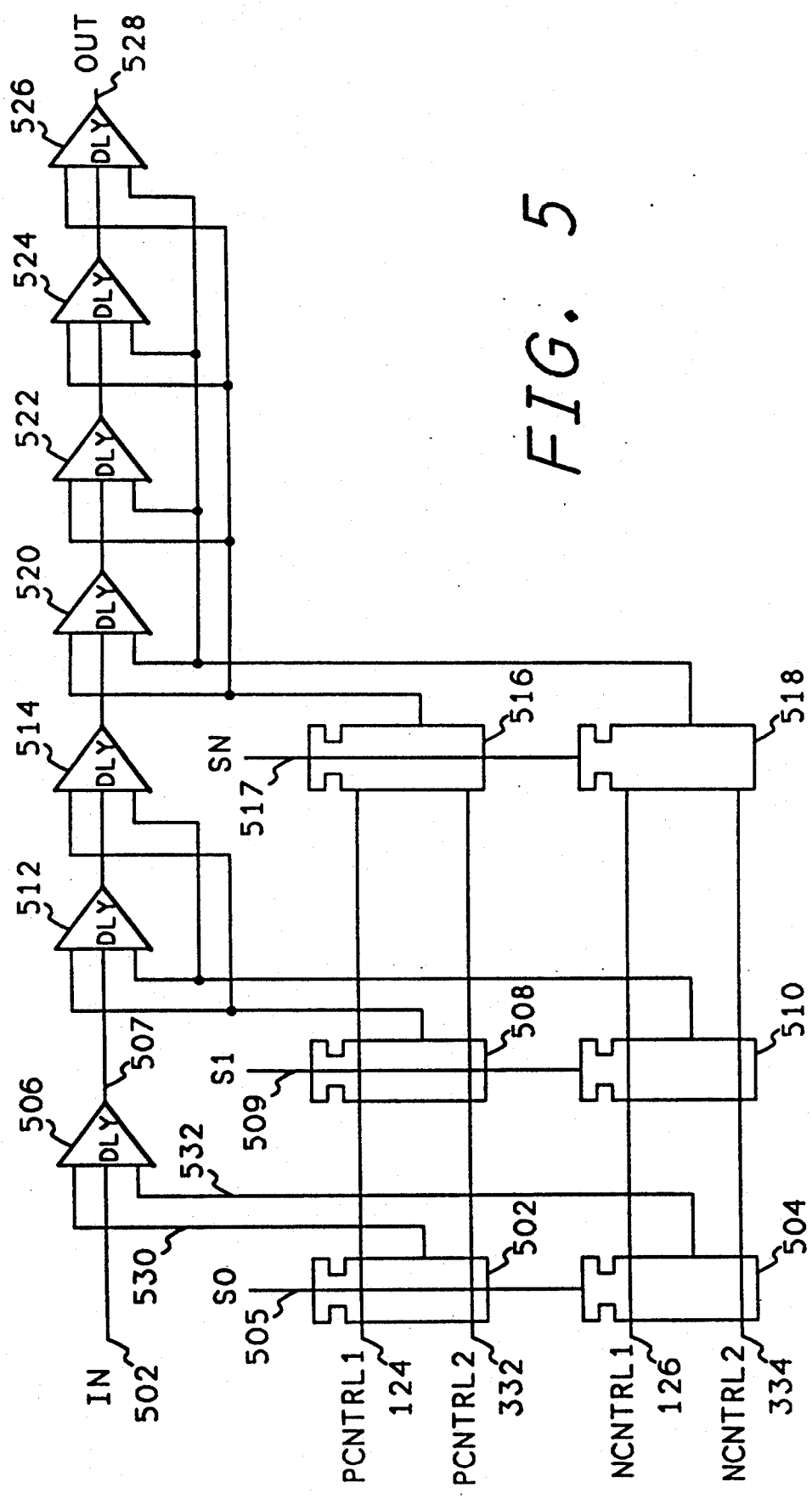
FIG. 5 shows an alternative embodiment of the delay circuit of FIG. 4.

FIG. 5 shows an alternative embodiment of the delay circuit of FIG. 4. The circuit of FIG. 4 used digital multiplexer circuits to select either a delayed or a nondelayed bit of information at each stage. The circuit of FIG. 5, on the other hand, uses analog multiplexers to select the control signals that are connected to the delay circuits. Referring now FIG. 5, IN signal 502 passes through a series of delay circuits 506, 512, 514, 520, 522, 524, and 526 before becoming the OUT signal 528. A plurality of multiplexer signals selects the control signal which is connected to each of the delay circuits. Multiplexers 502 and 504 select either a reference control signals, that is, PCNTRL1 124 and NCNTRL1 126, or the incremental control signals PCNTRL2 332 and NCNTRL2 334 to connect to the delay circuit 506. Therefore, the delay circuit 506 will provide a delay time defined by control signals PCNTRL1 and NCNTRL1 or by PCNTRL2 and NCNTRL2, depending on the setting of the S0 signal 505. Multiplexers 508 and 510 are used to select either of the control signals depending on the setting of the S1 bit 509. The outputs of the multiplexers 508 and 510 are connected to delay circuits 512 and 514 to delay the IN signal 502 two delays dependent on PCNTRL1 and NCNTRL1 or two delays dependent on PCNTRL2 and NCNTRL2, based upon the setting the S1 bit 509. Multiplexers 516 and 518 are used to select either of the control signals depending upon the setting of the S2 bit 517. The output of the multiplexers 516 and 518 are connected to the delay circuits 520, 522, 524, and 526 to cause a delay of four delays dependent on PCNTRL1 and NCNTRL1 or four delays dependent on PCNTRL2 and NCNTRL2, based upon the setting of the S2 signal 517. While the circuit of FIG. 5 accomplishes the same purpose as the circuit of FIG. 4, the circuit of FIG. 5 reduces the space requirements on an integrated circuit.

Having thus described a presently preferred embodiment of the present invention, it will now be appreciated that the aspects of the invention have been fully achieved, and it will be understood by those skilled in the art that many changes in construction and circuitry and widely differing embodiments and applications of the invention will suggest themselves without departing from the spirit and scope of the present invention. The disclosures and the description herein are intended to be illustrative and are not in any sense limiting of the invention, more preferably defined in scope by the following claims.

What is claimed is:

1. A digital delay circuit for delaying an input signal to provide a delayed output signal, said delay circuit having a delay control input bit, said delay circuit comprising:
   an incremental delay circuit having an input connected to said input signal, a delay control input connected to an incremental control signal, and having a first incremental control output signal,
   a reference delay circuit having an input connected to said input signal, a delay control input connected to a reference control signal, and having a first reference control output signal,
   means responsive to said delay control input bit for selecting said first incremental control output signal or said first reference control output signal to provide said output signal.

2. The digital delay circuit of claim 1 wherein said incremental control signal comprises a pair of signals, and wherein said reference control signal comprises a pair of signals.

3. A digital delay circuit for delaying an input signal to provide a delayed output signal, said digital delay circuit having a plurality of delay control input bits, wherein said plurality of delay control bits collectively define a multiple of a predetermined amount of delay, said digital delay circuit comprising:
   a first delay stage for delaying said input signal said predetermined amount of delay, said first stage comprising
      a controlled delay circuit having an input connected to said input signal, a delay control input connected to a delay control signal, wherein said delay control signal sets said predetermined amount of delay, and having a first controlled delay output signal,
      a reference delay circuit having an input connected to said input signal, a delay control input connected to a reference signal, and having a first reference delay output signal,
      means responsive to a low order bit of said delay control input bits for selecting said first controlled delay output signal or said first reference delay output signal to provide a first delay output signal; and a plurality of serially connected delay stages for delaying said first delay output signal a binary multiple of said predetermined amount of delay, each said stage having a stage input signal and a delayed stage output signal, wherein said input signal of a first of said plurality of stages is connected to said first delay output signal and wherein a delayed stage output signal of a last of said plurality of delay stages provides said delayed output signal, each said delay stage comprising a plurality of delay circuits, wherein a number of circuits in a subsequent delay stage is twice a number of circuits in an immediately preceding delay stage, and wherein a number of circuits in a first delay stage is two, each said delay stage comprising a set of serially connected controlled delay circuits for providing a controlled delay output signal, said circuits having a stage input signal connected to a delayed stage output signal of a previous stage and having a delay control input connected to said delay control signal, a set of serially connected reference delay circuits for providing a reference delayed output signal, said circuits having a stage input signal connected to a delayed stage output signal of a previous stage and having a delay control input connected to said reference signal, and means responsive to one of said delay control input bits for selecting said controlled delayed output signal or said reference delayed output signal to provide said delayed stage output signal.

4. The digital delay circuit of claim 3 wherein said delay control signal comprises a pair of signals, and wherein said reference signal comprises a pair of signals.

5. A digital delay circuit for delaying an input signal to provide a delayed output signal, said circuit having a delay control input bit, said digital delay circuit comprising:

an analog multiplexer circuit having a first input connected to an analog incremental control signal, a second input connected to an analog reference control signal, and a control input connected to said delay control input bit to select said analog incremental control signal or said analog reference control signal to provide an analog delay control output signal; and a delay circuit for providing said delayed output signal, said circuit having an input connected to said input signal and a delay control input connected to said analog delay control output signal.

6. A digital delay circuit for delaying an input signal to provide a delayed output signal, said circuit having a delay control input bit, said digital delay circuit comprising:

a pair of analog multiplexer circuits each having a first input connected to one of a pair of analog incremental control signals, each having a second input connected to one of a pair of analog reference control signals, and each having a control input connected to said delay control input bit to select said first input or said second input, wherein each of said analog multiplexer circuits provides one of a pair of analog delay control output signals; and a delay circuit for providing said delayed output signal, said circuit having an input connected to said input signal and a pair of delay control inputs connected to said pair of analog delay control output signals.

* * * * *